United States Patent [19]

Jorgensen

[11] Patent Number: 4,797,785
[45] Date of Patent: Jan. 10, 1989

[54] CIRCUIT ARRANGEMENT AND RESONANT LABEL, AND A PROCESS FOR ITS PRODUCTION

[75] Inventor: Paul R. Jørgensen, Almunecar, Spain
[73] Assignee: Durgo AG, Switzerland
[21] Appl. No.: 79,579
[22] Filed: Jul. 29, 1987

[30] Foreign Application Priority Data

Jul. 30, 1986 [CH] Switzerland ............... 3103/86

[51] Int. Cl.⁴ .................. H05K 1/16; H01G 7/00; C25D 5/02
[52] U.S. Cl. .................. 361/402; 29/25.42; 204/15
[58] Field of Search ............. 361/437, 271, 402, 288, 361/311, 312, 313, 323; 29/25.42

[56] References Cited

U.S. PATENT DOCUMENTS

| | | | |
|---|---|---|---|
| 3,921,167 | 11/1975 | Fox | 361/288 X |
| 4,369,557 | 1/1983 | Vandebult | 361/402 X |
| 4,560,445 | 12/1985 | Hoover et al. | 204/15 |

FOREIGN PATENT DOCUMENTS

| | | | |
|---|---|---|---|
| 2577067 | 8/1986 | France | |
| 8200541 | 2/1982 | PCT Int'l Appl. | 361/402 |
| WO83/01697 | 5/1983 | PCT Int'l Appl. | |

Primary Examiner—Donald A. Griffin
Attorney, Agent, or Firm—Ostrolenk, Faber, Gerb & Soffen

[57] ABSTRACT

To produce an electrically conducting circuit pattern (2), in particular a resonant label, on a substrate (1), the insulating layer to be provided between two surface sections (2, 2a) of the circuit pattern is applied in a liquid or pasty, i.e. deformable, state so that its thickness and arrangement can be more readily influenced. A typical circuit arrangement which can be produced by a process of this type is distinguished by the fact that either the insulating layer (6) is as thin as possible or it is present only over the conducting parts (2, 2a), whereas areas lying in between are free from such an insulating layer (6).

32 Claims, 2 Drawing Sheets

CIRCUIT ARRANGEMENT AND RESONANT LABEL, AND A PROCESS FOR ITS PRODUCTION

BACKGROUND OF THE INVENTION

The invention relates to a circuit arrangement. Such a circuit arrangement can serve various purposes but is used in particular for resonant labels. Processes for their production have been proposed in, for example, U.S. Pat. Nos. 3,913,219 and 4,369,557. In one case, an insulating substrate is provided on both sides with the associated surface sections of the circuit pattern, while in the other case the two surface sections are mounted next to one another on the substrate, which is then folded so that a double layer of the insulating substrate comes to rest between the two surface sections of the circuit pattern.

The problem with circuit arrangements produced in this manner is that at the cash register of a store which sells goods with such labels, the labels have to be deactivated by a current pulse. The thicker the insulating layer, the greater is this current pulse. Of course, the same problem exists in circuit arrangements for various safety and monitoring purposes, in which, for example, two conductors normally separated from one another by a dielectric are to be bridged by a current pulse in the event of an alarm. The polyethylene films usually used (as substrates) can be rolled in pore-free form only to about 30 micron, which would require a current pulse of about ten times the current necessary for resonant circuit activation. Of course, this current increases when a double layer of substrate is to be provided and, among other things, entails a more complicated circuit.

SUMMARY OF THE INVENTION

The invention is intended to achieve greater flexibility in the design and with regard to the dimensions of the insulating layer, this being achieved by a circuit arrangement in which a first surface section (2) of an electrically conducting circuit pattern (3) is present on a substrate (1) and has at least one surface area (4) which covers a surface area (4a) of a second surface section (2a), and is separated from this only by an insulating layer (6), which circuit arrangement possesses at least one of the following features:
 (a) the insulating layer (6) between the two surface areas (4, 4a) has at most the same thickness as the substrate (1);
 (b) the insulating layer (6) between the two surface areas (4, 4a) can be activated to form a binder;
 (c) the insulating layer (6) between the two surface areas (4, 4a) covers, at least in one area, only the conducting circuit pattern (2) but not the sections (10) in between.

The insulating layer (6) may have a maximum thickness of 20 micron, preferably less than 15 micron and in particular from 3 to 7 micron. The insulating layer (6) may consist of a heat-activatable and/or etchant-resistant adhesive, in particular a hot-seal adhesive.

A resonant label may include such a circuit arrangement, an inductor and a capacitor being provided, wherein the two overlapping surface sections (2, 2a) separated by the insulating layer (6) form at least one capacitor whose insulating layer (6) preferably has beads (11) projecting from between the surface areas (4, 4a) (FIG. 3). A resonant label may also include such a circuit arrangement, wherein two further overlapping surface areas (5, 5a) constitute contacts which have been electrically connected to one another by crimping through the insulating layer (6), the insulating layer (6) preferably possessing, in the region of the contacts, holes (6') along whose edge the two surface areas (5, 5a) are connected to one another essentially without interruption (FIG. 4). A resonant label may also include such a circuit arrangement, and further an inductor coil (3), wherein the overlapping surface areas (4, 4a or 5, 5a) lying inside the inductor coil (3) occupy less than 40%, preferably less than 25%, of the area (9) enclosed by the inductor coil (3).

In an advantageous process for the production of such a circuit arrangement, an insulating layer (6) is applied, in a liquid or pasty state, in one coating process, to an electrically conducting layer which is present on the substrate (1), and forms a first surface section (2) of the circuit pattern, and then a second surface section (2a) of the circuit pattern is applied to this insulating layer (6), which may still be liquid or pasty. Advantageously, the second surface section (2a) is likewise provided on a substrate (1a), this substrate (1a) is applied in such a way that the two surface sections (2, 2a) are separated from one another only by the insulating layer (6) and the substrate (1a) covers these layers (2, 2a, 6), and, if necessary, the substrate (1a) is then removed. The first surface section of the desired circuit pattern may be printed, with the aid of an etchant-resistant adhesive (6), onto a film of electrically conducting material which is applied to a substrate film (1), the surface areas (10) of the electrically conducting material which are present in between are then etched away, and then the section (2a) of electrically conducting material which is intended to be connected to the second side of the insulating layer (6) is introduced on a substrate film (1a) and is connected to this side, if necessary by hot-sealing. The insulating layer (6) may be first applied with a positive tolerance and only thereafter adjusted to the ideal thickness (h) in a control process, in particular by hot punching. In such process, at least two circuit arrangements may be included whose capacitors have different capacitances, the two circuit arrangements having qessentially identical circuit patterns, and, in order to obtain different capacitances for the two circuit arrangements, the layer thickness of the dielectric (6) between the capacitor plates (4, 4a) may be adjusted to different values.

It is important to note that it was previously thought that the insulating layer would have to be used as the substrate, and the two sections of a circuit pattern mounted one on each side of this substrate. However, according to the invention, the advantages of the procedure described herein were recognized; in this procedure, the only function of a substrate film is that it makes it possible to handle the circuit pattern, whereas the insulating layer has a small thickness unknown previously. It also consists of material previously unknown. It is mounted in a manner such that it covers only one of the surface sections of the conducting circuit pattern and separates it from the second surface section but does not cover those parts of the circuit pattern which lie in between. Thus, the use of a binder, in particular an adhesive, as an insulating layer has a further advantage. In order to bond the surface sections of the circuit to one another or to the insulating material, a pretreatment was generally necessary in the past if an aluminum layer was to be bonded to a plastic, such as polyethylene. This pretreatment can now be dispensed with, providing a further saving. In the production of conducting tracks, the use of an etchant-resistant coating (solvent!) is less advantageous in that the component density is constantly increasing and the conducting tracks therefore approach one another more and more closely, so that (inter alia, because of evaporation of the solvent) the desired precision can no longer be ensured. The insulating layer can be activated to become a binder, i.e. it possesses an inactive state without adhesive properties and an active state with such properties.

Each one of these measures in itself achieves some of the advantageous effect according to the invention in terms of saving of material costs and/or production costs, and, in the case of resonant labels, easier deactivation. However, it would of course be preferable if a plurality, or preferably all, of these measures were realized simultaneously.

Because a coating process is carried out with the insulating material in the liquid or pasty state, it is possible both to choose the thickness of the layer as desired and, if required, to alter the pattern of this layer at will. This also permits precise adjustment. Previously, unavoidable fluctuations in the thickness of the insulating layer also resulted in unavoidable frequency fluctuations, so that in practice it was necessary to use a whole frequency range instead of a particular frequency. Such a process is used primarily for printed circuits but is also suitable for hybrid circuits. The second surface section can be produced separately, but may also be provided on the same substrate, next to the first surface section, and then folded over the latter by folding the substrate onto the first surface section—in contrast to the teaching of U.S. Pat. No. 4,369,557 but in such a way that, instead of the substrate of the second surface section coming to rest on the first, the two surface sections of the circuit pattern face one another and are separated from one another only by the insulating layer applied by coating. The substrate film thus serves only to stabilize the circuit pattern present thereon, and in this case has any desired thickness and, if required, may even be thinner than the electrically conducting layer of the circuit pattern.

It is not absolutely essential for the second surface section of the circuit pattern also to be provided on a substrate, although this is preferred. It is also possible to apply the second surface section on the insulating coating, for example by a printing process.

A particularly advantageous embodiment is distinguished by the features wherein the insulating layer is initially applied with positive tolerance and then adjusted to a desired thickness. This provides a particularly simple way of trimming a capacitor to adjust it to a desired capacitance or (in the case of a resonant circuit or a resonant label) to a desired frequency. In fact, various attempts have already been made to solve this problem. According to U.S. Pat. No. 3,688,361, an additional layer of an insulating material and a plurality of small capacitor strips are to be provided, which can be switched in, in the event of insufficient capacitance (which was determined by a monitoring process). However, the additional layer implies further outlay, and it can readily be shown that the structure proposed in this U.S. Pat. No. 3,688,361 is very thick.

Consequently, U.S. Pat. No. 4,021,705 proposed carrying out the trimming not at the capacitor but at the inductor, by melting through individual sections of the winding.

However, such a procedure is susceptible to errors and moreover permits trimming to be carried out only in large increments—like the method according to U.S. Pat. No. 3,688,361. On the other hand, the process according to claim 10 permits stepless trimming, so that the desired frequency can be set very precisely. In principle, this process is not even restricted to the application of the insulating layer in liquid or pasty state, since it can be used for any insulating layer which is subsequently deformable, in particular under the action of heat. The process is expediently carried out at the end of the production, with simultaneous measurement of the value desired in each case (capacitance or frequency), the tool expediently being pressed down automatically via a comparator stage for comparing the ideal and actual values, until the difference is zero. Lowering the tool to a preset position will in general not give a desired frequency or capacitance value because irregularities in the insulating material and tolerances in the electrically conducting layer may give rise to deviations.

The features according to the invention are intended to reduce the capacitor size and hence the overall dimensions and/or to decrease the required current in resonant labels. Although this could also be achieved using a polyester film as the insulating layer, the process described is preferably used for the production. If the insulating layer is preferably thinner than the substrate film, it is expedient for it to be made at least 10% thinner.

The term binder should be understood in the widest sense and is intended to include all substances capable of displaying an adhesive action. A circuit arrangement of this type can be prepared in a more advantageous manner, since it was usual in the past first to apply an insulating layer and, if necessary, also a bonding layer to the first surface section of the circuit pattern, so that two operations were required. The above-mentioned embodiment simplifies the circuit arrangement and makes it cheaper. The adhesive need not necessarily be applied in the liquid or pasty state; instead, in the case of a pressure-activatable adhesive, it will be possible first to prepare a film from this adhesive and to bond this film to the first (and subsequently also to the second) surface section of the circuit pattern by pressing.

BRIEF DESCRIPTION OF THE DRAWINGS

Further details are given in the following description of embodiments shown schematically in the drawings.

DETAILED DESCRIPTION

Figure 1:
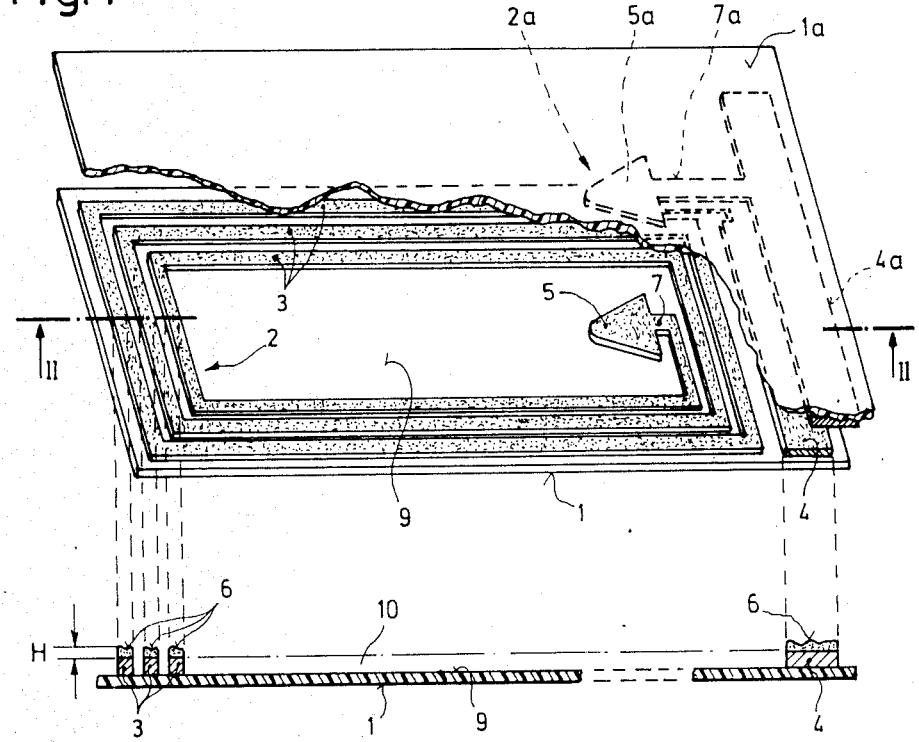
FIG. 1 shows a perspective view of the surface of a resonant label in exploded form.

FIG. 1 shows an insulating substrate 1 on which a first surface section 2 of an electrically conducting circuit pattern is applied, for example by printing or hot-sealing. The first surface section 2 includes a spiral-shaped inductor 3 and, at one end of this, the plate 4 of a capacitor, opposite which plate a corresponding plate 4a of a second surface section 2a is positioned—after a dielectric has been applied.

Figure 4:
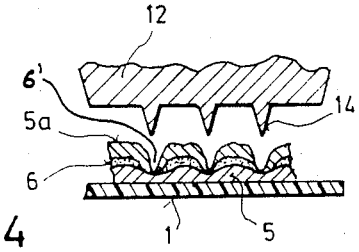
FIG. 4 shows a section similar to that in FIG. 3, but through the contact ends of the two surface sections of the circuit arrangement during crimping.

The substrate 1 is expediently in the form of a band, so that it can hold a number of such surface sections next to one another. Each of these surface sections 2 possesses a contact-strip end 5, which is "crimped", i.e. brought into contact, with a corresponding end 5a of the relevant second surface section by impressing with a punch possessing teeth, as illustrated in FIG. 4. The inductor 3 and capacitor 4 then represent a resonant circuit as used for resonant labels.

The second surface section 2a of the circuit arrangement comprises virtually only the required second capacitor plate 4a, which can likewise be applied to a substrate film 1a by printing or by vapor deposition, and an adjacent connecting section 7a, which corresponds to a similar connecting section 7 of surface section 2 or of the inductor 3 and likewise leads to a contact-strip end 5a. The contact-strip end 5a is shown in section in FIG. 4 and is formed similarly to the contact strip end 5.

Of course, the invention is not restricted to the use of only two surface sections; instead, it is also possible to provide more than two surface sections, for example in the type of arrangement according to U.S. Pat. No. 3,688,361. Furthermore, it is not necessary to provide a second substrate film 1a, although this is advantageous in the production process and subsequently also during use (for protection).

An embodiment of a process for the production of a circuit arrangement of resonant labels according to the invention will now be discussed with reference to FIG. 2 to 4. This process and the circuit arrangement are not restricted to resonant circuits but may apply as such to any printed or hybid circuits, for example also the circuits of a radio receiver, a radio transmitter (for example for giving an alarm signal in the event of a defect in a pipeline) or toys (for example remote-controlled models). A circuit arrangement of this type can then, for example, be adhesively bonded to a wall of the relevant apparatus instead of being fastened by screws.

Figure 2:
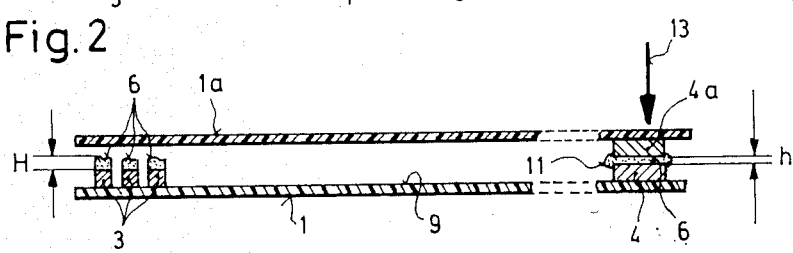
FIG. 2 shows a section along the line II—II of FIG. 1, through the lower surface section of such a resonant label.
Figure 3:
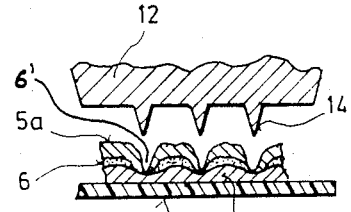
FIG. 3 shows a subsequent stage in the production of the circuit arrangement, in a section similar to that in FIG. 2.

The section according to FIG. 2 shows that an insulating layer 6 is applied to inductor 3 and capacitor plate 4, the said insulating layer serving as a dielectric in the case of capacitor 4, 4a.

In FIG. 2, the substrate film 1 is preferably relatively thin compared with the thickness of the electrically conducting layer of the first circuit section 2. However, this is not essential; instead, the thickness of these two layers 1, 2 can be chosen freely. For resonant labels, the circuit pattern 2 consists of, for example, an aluminum layer of not more than 50 micron, and the substrate consists of a polyethylene film, but preferably a polyester film. The thickness of this film is, for example, not more than 30 micron, and may be only 10 micron or less in the case of the polyester film.

The two layers 1, 2 can be bonded to one another in a conventional manner. For example, in the case of FIG. 2, the first circuit section 2 is already printed in the form shown in FIG. 1. On top of this the dielectric layer 6 is then positioned, this layer being applied in the plastic, i.e. deformable, state, in other words as a liquid or paste. This coating process can be carried out in any desired manner known for other coating operations, in particular by printing. Because of the deformability and this method of application, the layer thickness of the insulating layer 6 can be relatively easily controlled and in particular kept relatively thin, i.e. thinner than was possible hitherto.

In order to ensure good bonding of the insulating layer to the first surface section 2 of the circuit pattern on the one hand and to the associated second surface section 2a of the circuit pattern on the other hand, the insulating layer 6 preferably consists of an adhesive (in the widest sense). In a simple case, this may be an adhesive which can be activated by pressure; however, particularly in the case of the capacitors and the resonant circuits provided in resonant labels, it is advantageous to use either a hot-melt adhesive (in general at least 10 micron) or, particularly preferably, a hot-seal adhesive, in order to maintain a predetermined thickness of the dielectric. Adhesives of this type, for example those based on vinyl and acrylic compounds, are generally present in emulsion in a solvent, which is allowed to evaporate after the layer has been applied. In this way, it is possible to obtain extremely thin layers of about 3 to 4 micron. As a result, current pulses of only twice the level required for resonant circuit activation are sufficient (in the case of a resonant label) for deactivating the circuit.

Other advantages of a thin dielectric layer obtained in this manner are that the capacitor can have a small area, with the result that on the one hand, the total area of the label is reduced and, on the other hand, the area 9 which remains free inside the spiral of the inductor 3 is increased in size. This area 9 is penetrated by the magnetic field of the inductor. The signal thus obtained is therefore up to 30% stronger. However, the area 9 can be made even larger still (or, if desired, used for further inductor windings) if, as shown in FIG. 1, the capacitor plate 4—in contrast to the conventional one—is arranged outside the spiral of the inductor 3, whereas the contact strip ends 5, 5a are inside the inductor 3. It has been found that this has even further advantages: in fact, the magnetic field generated in the region of the free area 9 results in the formation of eddy currents in the capacitor plate 4 when the later is arranged inside the spiral of the inductor 3 in a conventional manner. This makes it necessary to make the capacitor plate 4 larger than would be required per se. Thus, by arranging the capacitor plate 4 outside the inductor 3, it is possible to achieve further miniaturization of a circuit of this type and of the resonant label.

As soon as the insulating coating has been applied, the second surface section 2a can also be applied. Purely for reasons of stabilization, this second surface section 2a of the circuit pattern may be applied to a substrate film 1a, for example also by vapor deposition. However, this substrate film 1a may also merely constitute the continuation of film 1, the two surface sections 2, 2a being present, for example, next to one another and the substrate films 1 and 1a being folded so that they are in a position as shown in FIG. 1. For this purpose, a weaker nominal folding position (not shown) can either be provided from the outset in the substrate 1 or 1a or produced only after the application of the electrically conducting circuit section 2 or 2a. However, it is not absolutely essential to provide the second surface section 2a of the circuit pattern on a substrate 1a; instead, this surface section 2a may also be applied directly to the insulating layer 6, for example by printing or vapor deposition. Such a process is particularly expedient when more than two surface sections 2, 2a are to be applied one on top of the other. Another possible method comprises first applying the second surface section 2a in the form of a transfer onto a substrate 1a, for example by vapor deposition, and then peeling off the substrate film 1a again after the surface sections 2, 2a have been laid one on top of the other.

In many cases, particularly, for example, when applied to leak detectors, it is even advantageous if the second substrate film 1a remains bonded to the circuit, in which case either the two substrate films 1, 1a can be hot-sealed together at the edge or the adhesive layer 6 is simply also applied over the edge regions of the substrate film 1, where it serves for bonding the two substrate films 1, 1a.

It has already been mentioned that, by applying the insulating layer 6 in the deformable state, it is possible not only to adjust its thickness more easily and to extremely thin dimensions but also to determine the coating pattern. In principle, the insulating layer could be designed to be essentially continuous, and the circuit pattern 2 or 2a already firmly printed on. Furthermore, the insulating layer could be interrupted in a region of the two surface sections of the circuit pattern in order to provide contact between these surface sections or to form a component of greater thickness, for example a resistance.

However, a more advantageous embodiment in this respect is one in which a continuous electrically conducting layer is first applied in a conventional manner to the substrate 1 (the latter need not be a plastic film but may furthermore be a silicon disk). The insulating layer is then applied on this in the form of the circuit pattern according to FIG. 1. This insulating layer is in turn expediently formed by an adhesive, which in this case, however, should have an additional property, i.e. should be resistant to etchants. Examples of an adhesive of this type are the hot-melt adhesives sold by Henkel under the name "Technomelt Q 2375" and "Q 2279". Although adhesives which can be activated by solvents are generally not preferred (because of possible blistering and the necessity of removing the solvent vapors by extraction), other etchant-resistant adhesives include, for example, LIOFOL UK 3640, which, together with the curing agent UK 6000, forms a two-component adhesive.

As shown in FIG. 2, the thickness of the insulating coating is initially within a certain tolerance range, this being indicated in the drawing by a waviness of the surface of this coating. The layer thickness is such that tolerances result only above a desired nominal value. Accordingly, the resulting layer thickness is H. In order to obtain an exact thickness of the dielectric and thus to set the capacitor 4 (FIG. 1) to a precise value (which was not readily feasible previously), the production is followed by control process involving measurement of the resonant frequency, in which the nominal thickness h (FIG. 3) is set, for example by compression by means of a hot ram (arrow 13). Rollers (for example heated ones) or scrapers would also be possible, although the latter are less frequently used.

However, before this stage, the regions 10 of the conducting layer are etched away (in the state shown in FIG. 2), and it is precisely the etchant-resistant adhesive which is required for this purpose. The regions forming the surface section 2 of the circuit pattern and comprising the parts 3 and 4 then remain. Such a procedure not only saves material but also simplifies the production, since in this procedure the adhesive has a plurality of functions. If the adhesive layer 6 is applied, not before etching has ended, in a nominal thickness h, and as a result edges 11 projecting slightly beyond the areas 2 (FIG. 3) are produced, this does not affect the dimensions of the area, which particularly in the case of a capacitor 4 must be very exact.

After application of the second surface section 2a (FIG. 1) to that surface section 2 of the circuit arrangement which has been treated according to FIG. 2, and before the control process described with reference to FIG. 3, the contact-strip ends 5, 5a are crimped together. This is carried out as shown in FIG. 4, using a hot ram 12 which possesses teeth 14, the numerous teeth 14 adjacent to one another ensuring good contact between the two parts 5, 5a.

It should be pointed out that the so-called "crimping" process is carried out according to known proposals (EP-A-142 380), simply by squeezing. If, however, a hot-seal adhesive is used as layer 6, for example according to the invention, the said adhesive can be melted, for example by ultrasound, then deformed with the aid of a ram, which may be heated, and cooled again with removal of the ram. This gives not simply a mechanical bond which may readily be broken by tumbling during use in practise, such a bond constantly leading to spoilage in known processes, but a bond which is chemically reinforced by adhesion.

Figure 5:
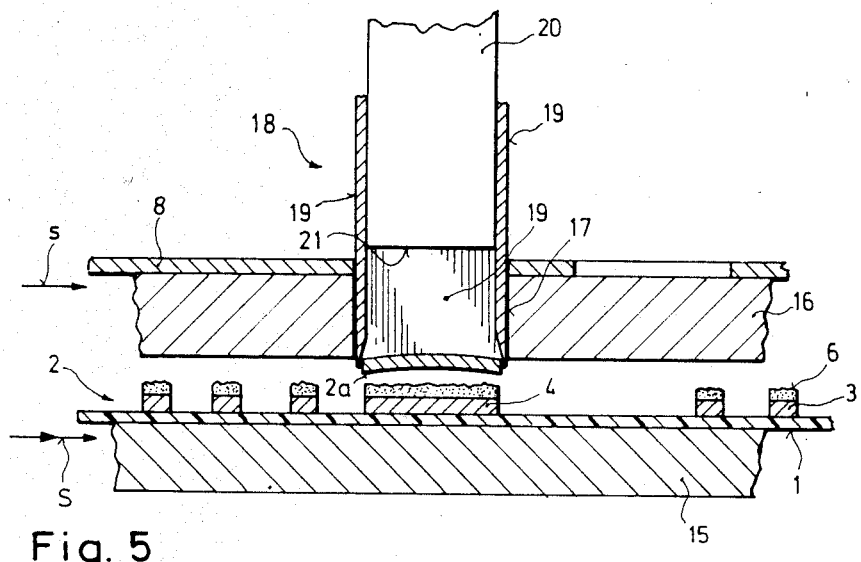
FIG. 5 shows a further section similar to that in FIG. 3, to illustrate the production of a resonant label having only one substrate film with the aid of a punching process.

Referring now to FIG. 5, as mentioned above, it is not necessary for both surface sections 2 and 2a of the circuit pattern to be applied to a substrate. At least one surface section, for example 2a, can be applied without a substrate film, for example as illustrated in FIG. 5. Here, the substrate film 1 with the surface section 2 and the adhesive layer 6, which is applied in a height H as shown in FIG. 2, is moved stepwise on a base 15, with a step size S (see arrow).

A punch screen 16 which has at least one opening 17 to permit the passage of a punching tool 18 is arranged parallel to the said base 15. When viewed from underneath, this punching tool 18 has the shape of surface section 2a (cf. FIG. 1) and consists of a cutting die 19 and a punch 20. Both tools 19, 20 can be operated independently of one another, by a predetermined displacement program (i.e. they are generally mechanically coupled to one another). Of course, it is quite possible to provide a plurality of such punching tools 18 for parallel substrate films 1, or one behind the other at a distance corresponding to a resonant label (or a multiple of this distance).

A belt 8 runs on top of the punch screen 16, the surface section 2a being punched out of the said belt by means of the punching tool 18 and being applied to the surface section 2 in the manner to be described. In order to save material (up to 80% of the conductor material is lost in an etching process as described above), the belt 8 of electrically conducting material, for example of aluminum, can be displaced with a relatively small step size s (see arrow) over the punch screen 16. The movement of the film 1 is then synchronized with that of the punching tool 18 in such a way that the cutting die 19 moves downward from a position above the belt 8 and higher than that shown in FIG. 5 only when the capacitor plate 4 and also the contact end 5 (not shown in FIG. 5) are located exactly under the opening 17 of the punch screen 16, the opening 17 of course also having the shape of the surface section 2a (FIG. 1). Hence, the belt 8 is parted along the edges of the opening 17 by the shear action of the cutting die 19, the punched-out surface section 2a generally being held by the lower end of the cutting die 19 but if necessary also falling immediately onto the adhesive layer 6 of the surface section 2.

The punch 20, which, for example, is heated, is then lowered. If necessary, ultrasound can be used for heating. The lower surface 21 of the punch 20 then presses the surface section 2a, which is held exactly in its position by the cutting die 19, onto the adhesive layer 6, to which the surface section 2a in any case adheres. The magnitude of the pressure exerted by the punch 20 determines the layer thickness of the adhesive 6 remaining as a dielectric between the surface sections 2, 2a; as mentioned above, it is advantageous to provide this layer thickness with a positive tolerance which is precisely adjusted only in a subsequent control process with the aid of a similar punch but with simultaneous measurement. The above description shows that the dielectric 6 can be obtained in any layer thickness in this manner, resulting in the desired frequencies of the resonant circuit thus produced. It is therefore possible, without changing the circuit pattern 2 or 2a, to obtain resonant circuits of any desired frequency, which results in a further saving. In addition to this, there is the saving of material which has already been mentioned and which can be increased even further if the surface sections to be punched out are present as a thin layer, which cannot be handled alone and may have been applied by vapor deposition, on the underneath of a substrate belt (not shown in FIG. 5 and corresponding to the substrate 2a in FIG. 1).

It should be mentioned that the production of resonant circuits of different frequencies with retention of the circuit pattern does not necessarily entail the use of a dielectric applied in a liquid or pasty state, since it would in fact be possible for the dielectric used to be a material which is deformable under the action of heat (or by some other means), for example a thermoplastic, which is then compressed to the desired dimension, advantageously during the control process. However, by using a liquid-pasty medium, in particular an adhesive, this process is easier to control, and subsequent changes due to residual flexibility are also excluded.

The punching procedure as described above by way of example is furthermore a substantially cheaper production process than, for example, etching by means of a photoresist film applied beforehand, partial crosslinking by exposure, dissolving away the unexposed parts, etching away the aluminum underneath and then removing the remaining photoresist film by abrasion.

The adhesive is preferably applied by screen printing, tampon printing or rotary gravure printing; a very precise line pattern can be obtained, whereas, with imprecise work, so-called "bottlenecks" may result when constrictions occur on both sides of a conducting track.

Within the scope of the invention, numerous variants are possible; for example, an insulating film can be converted into a deformable or plastic state by heating or by means of a solvent and can be used as insulating layer 6, the film being brought to the ideal thickness by pressure. However, it should be mentioned that the fact that an adhesive in principle has a substantially lower dielectric constant is sufficient to make it preferable to use an adhesive. Consequently, it is preferable to use a material having a dielectric constant of not more than 3.0 as the coating (for comparison: a polyester has a constant of 3.6 whereas a typical hot-seal adhesive has a constant of only 2.3). Of course, it is also possible for the contact-strip ends 5, 5a to have any desired shape, i.e. they need not necessarily be triangular.

If it is intended to remove the substrate 1a after application of the second surface section 2a of the circuit pattern, this need not necessarily be effected by peeling in the manner of a transfer; instead, for example, removal simply by chemical/physical means would also be possible. For this purpose, the substrate 1a can consist, for example, of an alginate (soluble in soapy water) or of a material having a low melting point.

EXAMPLES

An example of calculation is now given in order to illustrate the invention.

In a resonant circuit, the aim must be to obtain as strong a signal as possible (Q factor, quality of the coil) in conjunction with as small an area as possible. This is in principle a contradictory requirement, since the signal will be stronger the larger the inductance coil 3 and the free area 9 inbetween. On the other hand, for reasons of production costs alone (material and quantity/unit time), but also in order to achieve as extensive a field of use as possible for the safety (resonant) label to be produced, it is necessary to ensure as small an area as possible.

The inductance L is obtained from the formula $$L = \frac{A.A \times N.N}{2.54 (8 \times A + 11 \times D)} \quad (1)$$

where

N is the number of windings of the inductor 3,
D is the radial depth of the windings (cf. FIG. 6) and
A is the mean radius of the windings.

Figure 6:
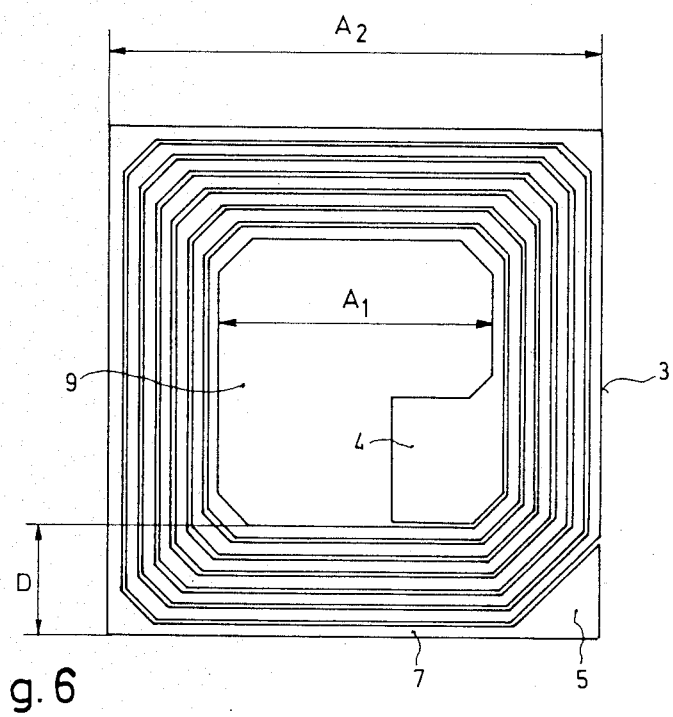
FIG. 6 shows a plan view of another embodiment, which is used to explain a calculation of its dimension.

The mean radius in cm is obtained, according to FIG. 6, from the formula $$\frac{A1 + A2}{4} \cdot 1.2 \quad (2)$$

In formula (1), however, the exciting magnetic field is not taken into account, whereas the magnitude of the free area 9 is taken into account indirectly through the dependence of D and A. On the other hand, this formula (1) furthermore includes neither the thickness of the material nor the space between the conducting tracks, which are likewise important, so that formula (1) is only an approximate formula.

The frequency of the resonant circuit to be produced is obtained from the formula $$f = \frac{1}{2 \text{ micron } L \cdot C} \quad (3)$$

where

L is the inductance and
C is the capacitance of the capacitor in picofarad.

In formula (3), the capacitance C can be derived from the following formula:

$$C = \frac{A. K. N}{11.3 \times t} \quad (4)$$

where

A is the area of the capacitor in cm², 
K is the dielectric constant, 
N is the number of layers (areas 4, 4a and any further associated surface regions) of capacitors which are connected to one another, 
t is the thickness of the dielectric in cm, and 
N is a constant and is, for example, 1.

Thus, if for a practical application A1 is 2.7 cm and A2 is 4.7 cm in FIG. 6, formula (2) gives a mean radius of 2.22 cm.

It is now further assumed that D=1 and L=3.306, the frequency f being 8.2 MHz. In this case, formula (3) gives a required capacitance C of 113.8 pF. For a capacitor of this type, formula (4), or the formula obtained by rearranging this to calculate A, gives a required area of 0.64 cm² if it is assumed that the thickness t is 10 micron (0.001 cm) and, where a hot-seal adhesive is used, K is 2. In comparison with the conventional use of polyethylene, which cannot be produced thinner than 30 micron and has a dielectric constant K of 2.3 (giving an area A of 1.677 cm²), this means that, according to the invention, the area of the capacitor is 1/2.5 times the area of the capacitor in known resonant labels (or more precisely, the area is usually about 2.6 times as large, the free area 9 thus being reduced by about 1 cm²).

If such a difference in the capacitor sizes is assumed and the remaining free areas 9 are compared, the result for a total area of, for example, 2.7 times 2.7 cm (=7.29 cm²) enclosed by the inductor windings 3, minus the capacitor area required, is a free area 9 of 6.65 cm² for the embodiment according to the invention and an area 9 of 5.61 cm² for the conventional embodiment. Thus, this means a reduction in the area 9 of about 15.6% compared with the embodiment according to the invention; in other words, the capacitor occupies 8.8% of the area in this example in the embodiment according to the invention, and as much as 23% in the conventional embodiment.

However, because of the more favorable conditions resulting from the embodiment according to the invention, a clearer signal is obtained and in addition there is the advantage that the resonant label can be deactivated by smaller currents, which also makes it possible to simplify the circuit in the relevant electric circuit.

With a resonant label produced using the above information, it is possible to obtain the desired resonant frequencies merely by adjusting the thickness t, without having to alter the circuit pattern. The following relationships between frequency f and thickness t resulted:

TABLE 1

| Frequency f in MHz | Thickness t (micron) of the layer 6 |
| --- | --- |
| 8.2 | 10 |
| 10.0 | 15 |
| 11.0 | 18 |
| 7.5 | 8.2 |

Of course, only a few examples have been described here, and all intermediate values as well as any other values are obtainable; in each case, it is possible to use the same circuit pattern, which was not possible previously. This further reduces the costs. As a rule of thumb, it is found that a 10% change in the frequency corresponds to a change of 20% in the thickness t. Since this thickness t can be adjusted very precisely, and moreover the control process described above is preferably carried out, the frequencies can be set with extremely narrow tolerances, whereas conventional resonant labels had to operate with a frequency band width of about 20%.

It should be mentioned that the above computational example serves merely as an illustration and that, if necessary, even smaller capacitor areas or thicknesses t are achievable, so that the costs can be substantially reduced and the desired frequency obtained with greater precision.

I claim:

1. A circuit arrangement comprising:
   a substrate;
   a first circuit pattern formed on the substrate which comprises a first circuit section and a second circuit section; and
   a second circuit pattern superposed on the first circuit pattern, which comprises a third circuit section and a fourth circuit section;
   said second and fourth circuit sections having corresponding size and shape and being separated and adhered by an adhesive insulating material; and
   wherein said first and third circuit sections have an adhesive insulating layer therebetween, and crimped portions of at least one of said first and third circuit sections extend through said insulating layer for directly conductively interconnecting said first and third circuit sections.

2. An arrangement as in claim 1, wherein the thickness of the adhesive insulating material is not substantially greater than that of the substrate.

3. An arrangement as in claim 1, wherein the material of the adhesive insulating material has a non-adhesive state in which it is non-adhesively applicable to said first pattern, and an adhesive state in which it binds said second circuit pattern to said first circuit pattern.

4. An arrangement as in claim 3, wherein the insulating material comprises a heat-activatable adhesive.

5. An arrangement as in claim 3, wherein the insulating layer comprises a hot-seal adhesive.

6. An arrangement as in claim 1, wherein the insulating material comprises an etchant-resistant adhesive.

7. An arrangement as in claim 1, wherein at least a portion of said substrate not having said first circuit pattern thereon is substantially free of said adhesive insulating material.

8. An arrangement as in claim 1, wherein said adhesive insulating material has a maximum thickness of substantially 20 microns.

9. An arrangement as in claim 8, wherein said maximum thickness is substantially no greater than 15 microns.

10. An arrangement as in claim 9, wherein said maximum thickness is substantially no greater than 7 microns.

11. An arrangement as in claim 10, wherein the thickness of said adhesive insulating material is substantially at least 3 microns.

12. An arrangement as in claim 1, wherein:
   said second and fourth circuit sections form a capacitor;
   said first circuit section forms an inductor conductively interconnected with said second circuit section; and
   said circuit arrangement forms an LC resonant circuit which includes said inductor in series with said capacitor.

13. A resonant label comprising:

a substrate;

a first circuit pattern formed on the substrate, which comprises a first circuit portion and a second circuit portion; and a second circuit pattern superposed on the first pattern, which comprises a third circuit portion and a fourth circuit portion;

said second and fourth circuit portions having corresponding size and shape and being separated and adhered by an adhesive insulating layer; and wherein said first and third circuit portions have an adhesive insulating layer therebetween, and crimped portions of at least one of said first and third circuit portions extend through said insulating layer for directly conductively interconnecting said first and third circuit portions.

14. A resonant label as in claim 13, wherein beads of said adhesive insulating layer project beyond said second and fourth circuit portions.

15. A resonant label as in claim 13, wherein said first circuit portion further defines a lower contact pad directly conductively interconnected with said inductor, said lower contact pad being conductively interconnected by said crimped portions with said third circuit portion, the latter defining a corresponding upper contact pad.

16. A resonant label as in claim 15, wherein said inductor of said first circuit portion defines a surface area on said substrate, said lower contact pad being within said surface area and occupying less than substantially 40 percent of said surface area.

17. A resonant label as in claim 16, wherein said lower contact pad occupies less than substantially 25 percent of said surface area.

18. A resonant label as in claim 16, wherein said capacitor is outside said surface area defined by said inductor.

19. A resonant label as in claim 13, wherein:

said first circuit portion forms an inductor conductively interconnected with said second circuit portion;

said second and fourth circuit portions form a capacitor; and said first and second circuit patterns form an LC resonant circuit which includes said inductor in series with said capacitor.

20. A resonant label as in claim 13, wherein said adhesive insulating layer comprises an etchant-resistant adhesive.

21. A process for manufacturing a circuit arrangement comprising the steps of:

applying a first circuit pattern having first and second circuit portions on a substrate;

applying an adhesive insulating layer to said first circuit pattern;

superposing a second circuit pattern having third and fourth circuit portions on said adhesive insulating layer, said second and fourth circuit portions having corresponding size and shape and being adhered and separated by said adhesive insulating layer; and crimping portions of at least one of said first and third circuit portions so as to extend through said insulating layer and directly conductively interconnect said first and third circuit portions.

22. A process as in claim 21, wherein said adhesive insulating layer is initially applied to said first circuit pattern in a non-adhesive state, and is activated after application of said second circuit pattern to be in an adhesive state.

23. A process as in claim 21, wherein said second circuit pattern is initially applied to a second substrate, said second circuit pattern being on said second substrate when it is superposed on said adhesive insulating layer.

24. A process as in claim 23, wherein said second substrate is subsequently removed.

25. A process as in claim 23, wherein said second substrate is subsequently or simultaneously adhered to said first substrate by said adhesive insulating layer.

26. A process as in claim 25, wherein said top substrate is adhered to said bottom substrate by heat-sealing.

27. A process as in claim 21, wherein said first circuit pattern is formed by the steps of:

applying an electrically conducting film to said substrate;

employing an etchant-resistant material as said adhesive insulating layer;

applying said adhesive insulating layer to said film in a pattern corresponding to said first circuit pattern; and etching portions of said film not having said adhesive insulating layer applied thereto.

28. A process as in claim 21, wherein said adhesive insulating layer is initially applied with a positive thickness tolerance and is then adjusted to a lesser thickness.

29. A process as in claim 28, wherein said thickness is adjusted by hot-punching.

30. A process as in claim 21, wherein said second and fourth circuit portions define a capacitance, said capacitance being adjusted by adjusting the thickness of said adhesive insulating layer between said second and fourth circuit portions.

31. A process as in claim 21, wherein:

said second and fourth circuit portions form a capacitor;

said first circuit portion forms an inductor conductively interconnected with said second circuit portion; and said circuit arrangement forms an LC resonant circuit which includes said inductor in series with said capacitor.

32. A process as in claim 21, wherein said adhesive insulating layer comprises an etchant-resistant adhesive.

* * * * *